US011187946B2

(12) United States Patent
Lee et al.

(10) Patent No.: US 11,187,946 B2
(45) Date of Patent: Nov. 30, 2021

(54) DISPLAY DEVICE

(71) Applicant: SAMSUNG DISPLAY CO., LTD., Yongin-si (KR)

(72) Inventors: Changsoo Lee, Suwon-si (KR); Byoungsun Na, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 87 days.

(21) Appl. No.: 16/236,819

(22) Filed: Dec. 31, 2018

(65) Prior Publication Data

US 2019/0204652 A1 Jul. 4, 2019

(30) Foreign Application Priority Data

Jan. 2, 2018 (KR) ........................ 10-2018-0000130

(51) Int. Cl.

| | |
|---|---|
| ***H05K 1/14*** | (2006.01) |
| ***G02F 1/1345*** | (2006.01) |
| ***G02F 1/1362*** | (2006.01) |

(52) U.S. Cl.

CPC ...... *G02F 1/13452* (2013.01); *G02F 1/13458* (2013.01); *G02F 1/136286* (2013.01); *H05K 1/14* (2013.01)

(58) Field of Classification Search

CPC ........................... G02F 1/13305–13306; G02F 1/13452–13454; G09G 3/32; G09G 3/3291; H05K 1/11; H05K 1/14; H05K 1/141; H05K 1/18; H01L 23/495–498; H01L 23/49811; H01L 23/4985; H01L 25/18; H01L 25/50

USPC ................ 361/749–750, 760, 761, 784, 803; 349/55, 149–155; 174/250–258

See application file for complete search history.

(56) References Cited

U.S. PATENT DOCUMENTS 5,016,986 A * 5/1991 Kawashima .......... G02F 1/1345 349/138
5,402,255 A * 3/1995 Nakanishi ........... H01L 23/4985 349/150
5,739,887 A * 4/1998 Ueda ................ G02F 1/133604 349/149
6,380,918 B1 * 4/2002 Chiba ................ G02F 1/13452 345/90
6,407,795 B1 * 6/2002 Kamizono ........... G09G 3/3611 349/149
6,411,359 B1 * 6/2002 Kobayashi .......... G02F 1/13452 349/149
6,636,281 B1 * 10/2003 Kanatsu .............. G02F 1/13452 349/58

(Continued)

FOREIGN PATENT DOCUMENTS

KR 10-2005-0091290 9/2005
KR 10-2014-0064156 5/2014

(Continued)

*Primary Examiner* — Tuan T Dinh
(74) *Attorney, Agent, or Firm* — F. Chau & Associates, LLC

(57) ABSTRACT

A display device includes: a display substrate including an upper surface, a lower surface facing the upper surface, and a side surface connected to the upper surface and the lower surface; a plurality of drivers disposed on the side surface of the display substrate; and a connection wiring film attached to the side surface of the display substrate, and electrically connecting the drivers.

19 Claims, 10 Drawing Sheets

(56) References Cited

U.S. PATENT DOCUMENTS 7,023,517 B2 * 4/2006 Song ................. G02F 1/134363 349/150
7,034,913 B2 * 4/2006 Ishida ................. G02F 1/13452 345/104
7,420,821 B2 * 9/2008 Sakaki ................... H05K 1/147 349/149
7,683,496 B2 * 3/2010 Lee ....................... H01L 23/544 257/797
7,724,340 B2 * 5/2010 Kang ................ G02F 1/133615 349/149
9,030,826 B2 * 5/2015 Kim .................... H01L 23/3736 361/719
9,632,381 B2 4/2017 Kang et al.
2002/0140654 A1 * 10/2002 Kim .................... G02F 1/13452 345/87
2008/0239228 A1 * 10/2008 Lee ..................... G02F 1/13452 349/151
2013/0141881 A1 * 6/2013 Nobori ................... H05K 3/361 361/749
2016/0183387 A1 * 6/2016 Tsunekawa ....... G02F 1/133308 361/749
2017/0017109 A1 * 1/2017 Park .................... G02F 1/13394
2017/0082900 A1 * 3/2017 Kong .................. G02F 1/13458
2017/0357121 A1 * 12/2017 Cho ....................... G02F 1/1368
2017/0358602 A1 * 12/2017 Bae .......................... H01L 24/08
2018/0067353 A1 * 3/2018 Son ..................... G02F 1/13452
2018/0088389 A1 * 3/2018 Furuta .................. B23K 1/0008
2018/0166435 A1 * 6/2018 Lee ................... G02F 1/136204

FOREIGN PATENT DOCUMENTS

KR 10-2014-0136233 11/2014
KR 10-2015-0047711 5/2015
KR 10-2015-0072743 6/2015

* cited by examiner

DISPLAY DEVICE

CROSS-REFERENCE TO RELATED APPLICATION

This application claims priority under 35 U.S.C. § 119 to Korean Patent Application No. 10-2018-0000130, filed on Jan. 2, 2018, in the Korean Intellectual Property Office (KIPO), the disclosure of which is incorporated by reference herein in its entirety.

1. Technical Field

Exemplary embodiments of the present invention relate to a display device, and more particularly, to a display device with a small bezel area and little signal delay.

2. Discussion of Related Art

Display devices may include liquid crystal display ("LCD") devices, organic light emitting diode ("OLED") display devices, plasma display panel ("PDP") devices, electrophoretic display devices, and the like.

As a display device increases in resolution and size, its non-display area decreases. Accordingly, the width and interval of wirings in the non-display area have become narrower.

SUMMARY

According to an exemplary embodiment of the present invention, a display device includes: a display substrate including an upper surface, a lower surface facing the upper surface, and a side surface connected to the upper surface and the lower surface; a plurality of drivers disposed on the side surface of the display substrate; and a connection wiring film attached to the side surface of the display substrate, and electrically connecting the drivers.

The connection wiring film may not be disposed on the upper surface of the display substrate.

The connection wiring film may include: a base portion disposed between two adjacent drivers; and a connection wiring disposed on the base portion and electrically connecting the two adjacent drivers.

The display substrate may include: a plurality of pixels; a gate line and a data line for driving the plurality of pixels; a gate pad disposed on the upper surface of the display substrate; a data pad disposed on the upper surface of the display substrate; a first side electrode electrically connected to the gate pad and disposed on the side surface of the display substrate; and a second side electrode electrically connected to the data pad and disposed on the side surface of the display substrate.

At least one of the drivers may include: a circuit board including a first line electrode; and a driving chip.

The display device may further include an anisotropic conductive film disposed between the first line electrode and the first side electrode.

The display device may further include an anisotropic conductive film disposed between the connection wiring film and the first line electrode.

The display substrate may further include: an auxiliary pad disposed on the upper surface of the display substrate and connected to the gate pad; an auxiliary side electrode electrically connected to the auxiliary pad and disposed on the side surface of the display substrate; and an anisotropic conductive film disposed between the connection wiring film and the auxiliary side electrode.

The first line electrode may directly contact the first side electrode.

The connection wiring film may directly contact the first side electrode.

The display substrate may further include: an auxiliary pad connected to the gate pad; and an auxiliary side electrode electrically connected to the auxiliary pad and disposed on the side surface of the display substrate. The connection wiring film may directly contact the auxiliary side electrode.

The drivers may include a gate driver and a data driver, and the connection wiring film may electrically connect the gate driver and the data driver to each other.

The drivers may include: a gate driver and a data driver; and a bridge wiring disposed on the upper surface of the display substrate, wherein the bridge wiring electrically connects the gate driver and the data driver to each other.

According to an exemplary embodiment of the present invention, a display device includes: a display substrate including an upper surface, a lower surface facing the upper surface, and a side surface connected to the upper surface and the lower surface; a plurality of drivers disposed on the side surface of the display substrate; and a connection wiring film disposed between the plurality of drivers and electrically connecting the drivers. The connection wiring film includes a base portion.

The display device may further include an anisotropic conductive film disposed between the side surface of the display substrate and the plurality of drivers to electrically connect the display substrate with the plurality of drivers.

The display device may further include an anisotropic conductive film electrically connecting the plurality of drivers with the connection wiring film.

The display device may further include a first side electrode disposed on the side surface of the display substrate. The first side electrode may directly contact at least one of the plurality of drivers.

The connection wiring film may directly contact at least one of the plurality of drivers.

The display substrate may include: a pad electrically connected to at least one of the drivers; an auxiliary pad connected to the pad through an auxiliary bridge line; an auxiliary side electrode electrically connected to the auxiliary pad and disposed on the side surface of the display substrate; and an anisotropic conductive film disposed between the connection wiring film and the auxiliary side electrode.

The display substrate may include: a pad electrically connected to at least one of the drivers; an auxiliary pad connected to the pad through an auxiliary bridge line; and an auxiliary side electrode electrically connected to the auxiliary pad and disposed on the side surface of the display substrate. The connection wiring film may directly contact the auxiliary side electrode.

According to an exemplary embodiment of the present invention, a display device includes: a display substrate comprising an upper surface, a lower surface facing the upper surface, a first side surface connected to the upper surface and the lower surface, and a second side surface connected to the upper surface and the lower surface; a data driver disposed on the first side surface; a gate driver disposed on the second side surface; and a connection wiring film disposed on the first and second side surfaces and connecting the data driver and the gate driver to each other.

BRIEF DESCRIPTION OF THE DRAWINGS

The above and other features of the present invention will become more apparent by describing in detail exemplary embodiments thereof with reference to the accompanying drawings, wherein.

DETAILED DESCRIPTION OF THE EMBODIMENTS

Figure 1:
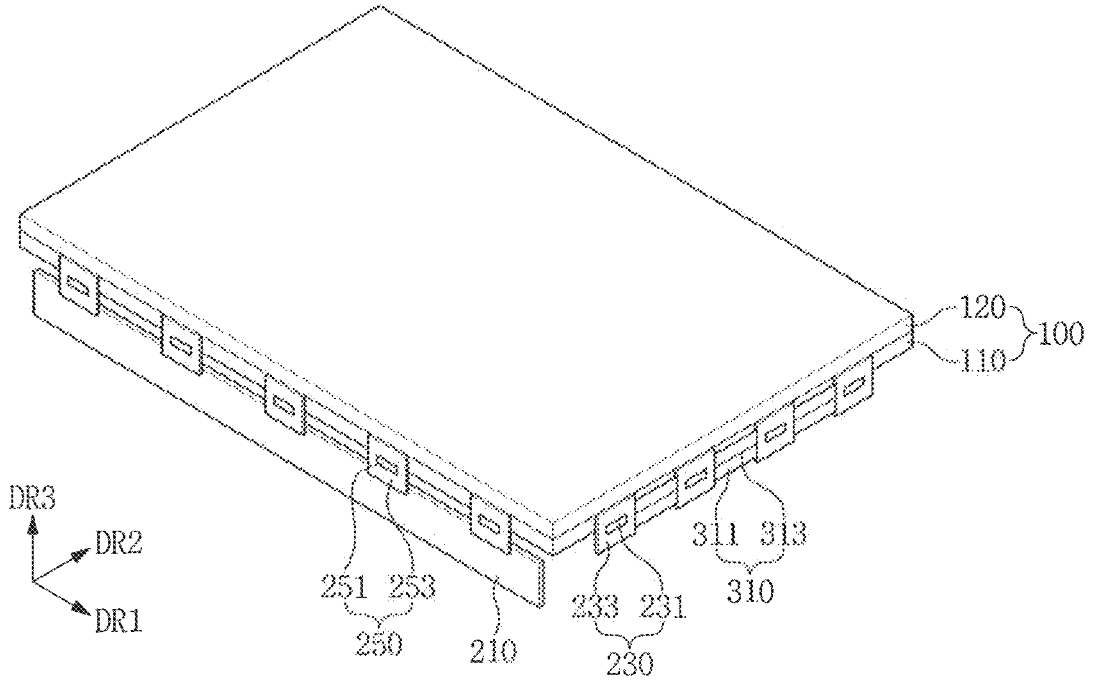
FIG. 1 is a perspective view illustrating a display device according to an exemplary embodiment of the present invention.

Exemplary embodiments of the present invention will now be described more fully hereinafter with reference to the accompanying drawings. The present invention may, however, be embodied in many different forms and should not be construed as being limited to the exemplary embodiments set forth herein.

In the drawings, thicknesses of a plurality of layers and areas may be illustrated in an enlarged manner for clarity and ease of description thereof. When a layer, area, or plate is referred to as being "on" another layer, area, or plate, it may be directly on another layer, area, or plate, or intervening layers, areas, or plates may be present therebetween. In the drawings, like reference numerals may refer to like elements.

Throughout the specification, when an element is referred to as being "connected" to another element, the element may be "directly connected" to the another element, or "electrically connected" to the another element with one or more intervening elements interposed therebetween.

"About" or "approximately" as used herein may be inclusive of the stated value and means within an acceptable range of variation for the particular value as determined by one of ordinary skill in the art, considering the measurement in question and the error associated with measurement of the particular quantity (e.g., the limitations of the measurement system). For example, "about" may mean within one or more standard variations, or within ±30%, 20%, 10%, 5% of the stated value.

Hereinafter, an exemplary embodiment of the present invention will be described in detail with reference to FIGS. 1 to 6.

Figure 2:
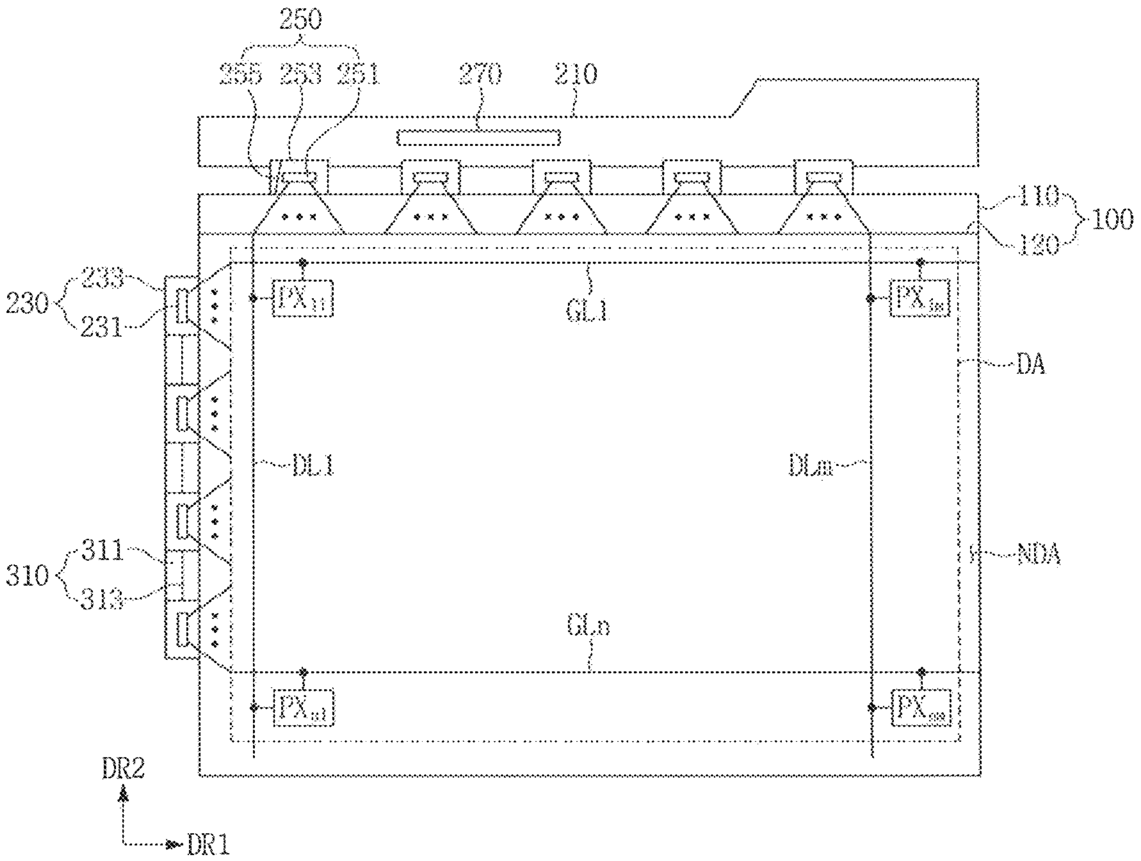
FIG. 2 is a plan view illustrating a display device according to an exemplary embodiment of the present invention.

FIG. 1 is a perspective view illustrating a display device according to an exemplary embodiment of the present invention, and FIG. 2 is a plan view illustrating a display device according to an exemplary embodiment of the present invention.

Referring to FIGS. 1 and 2, a display device includes a display panel 100, a main circuit board 210, a gate driver 230, a connection wiring film 310, a data driver 250, and a signal controller 270.

Examples of the display panel 100 may include an organic light emitting diode ("OLED") display panel, a liquid crystal display ("LCD") panel, a plasma display panel ("PDP"), an electrophoretic display panel, a microelectromechanical system ("MEMS") display panel, or an electrowetting display panel. Hereinbelow, an LCD panel will be described as the display panel 100 according to an exemplary embodiment of the present invention. However, the present invention not limited thereto.

The display panel 100 may include a first substrate 110 and a second substrate 120 disposed on the first substrate 110. A liquid crystal layer may be disposed between the first substrate 110 and the second substrate 120.

For convenience of explanation, a length direction of the display panel 100 is referred to as a first direction DR1, a direction intersecting the first direction DR1 and parallel to the display panel 100 is referred to as a second direction DR2, and a thickness direction of the display panel 100 is referred to as a third direction DR3. However, the directions indicated by the directions DR1, DR2, DR3 may correspond to other directions.

As illustrated in FIG. 2, the display panel 100 includes, on a plane, a display area DA on which a plurality of pixels PX11 to PXnm are arranged and a non-display area NDA surrounding the display area DA.

The first substrate 110 includes a plurality of gate lines GL1 to GLn, and a plurality of data lines DL1 to DLm which intersect the plurality of gate lines GL1 to GLn. In addition, the first substrate 110 includes the plurality of pixels PX11 to PXnm connected to the gate lines GL1 to GLn and the data lines DL1 to DLm. The plurality of gate lines GL1 to GLn and the plurality of data lines DL1 to DLm are connected to a driver. In such an embodiment, the driver includes the gate driver 230 and the data driver 250. Accordingly, the plurality of gate lines GL1 to GLn are connected to the gate driver 230, and the plurality of data lines DL1 to DLm are connected to the data driver 250.

The plurality of pixels PX11 to PXnm may be divided into a plurality of groups according to colors to be displayed on the display panel 100. The plurality of pixels PX11 to PXnm may display one of the primary colors. The primary colors may include red, green, blue, and white. However, the present invention is not limited thereto, and the primary colors may further include other colors such as yellow, cyan, and magenta.

The plurality of gate drivers 230 generate gate signals based on a gate control signal during frame periods. The gate driver 230 outputs the gate signals to the gate lines GL1 to GLn. The gate signals may be sequentially output corresponding to horizontal periods. However, the present invention is not limited thereto, and one gate driver 230 may generate all of the gate signals.

The gate driver 230 may include a gate driving chip 231 and a gate circuit board 233 on which the gate driving chip 231 is mounted. As an example, the gate circuit board 233 may be a flexible printed circuit board, but the present invention not limited thereto. The plurality of gate drivers 230 may be arranged along the second direction DR2.

According to an exemplary embodiment of the present invention, the gate circuit board 233 may be disposed on at least one side surface of side surfaces of the display panel 100. For example, the gate circuit board 233 may be disposed on at least one side surface of the side surfaces of the first substrate 110. The gate circuit board 233 is electrically connected to the gate lines GL1 to GLn and transmits the gate signals output from the gate driving chip 231 to the gate lines GL1 to GLn.

According to an exemplary embodiment of the present invention, the gate driver 230 and the data driver 250 may be a tape carrier package (TCP) type.

In the case where one end of a conventional gate circuit board is disposed in the non-display area NDA of the display panel 100, the non-display area NDA includes an area in which the one end of the conventional gate circuit board is disposed. On the other hand, since the gate circuit board 233 according to an exemplary embodiment of the present invention is disposed on at least one side surface of the side surfaces of the display panel 100, the non-display area NDA of the display panel 100 may be reduced. In other words, since one end of the gate circuit board 233 is not disposed in the non-display area NDA of the display panel 100, the non-display area NDA may be reduced by the area that would have been needed to accommodate the one end of the conventional gate circuit board. Accordingly, a display area DA of the display panel 100 according to an exemplary embodiment of the present invention may be enlarged. The display area DA and the non-display area NDA of the display panel 100 may not be located on the side surface of the display panel 100. For example, the display area DA and the non-display area NDA may be found on the upper or lower surface of the display panel 100 on which the image is displayed. Accordingly, when the display panel 100 is the same size as a conventional display panel including the conventional gate circuit board, since the non-display area NDA is reduced, the display area DA in which the image is displayed may be enlarged. However, the present invention is not limited thereto, and one end of the gate circuit board 233 may be disposed in the non-display area NDA.

The connection wiring film 310 may be disposed between the gate drivers 230 which are disposed on at least one side surface of the side surfaces of the display panel 100. For example, the connection wiring film 310 may be disposed between the gate drivers 230 which are disposed on at least one side surface of the side surfaces of the first substrate 110. In addition, in the case where a length of the connection wiring film 310 is longer than a thickness of the display panel 100 or the first substrate 110, the connection wiring film 310 may be disposed on back surfaces of the display panel 100 or the first substrate 110.

According to an exemplary embodiment of the present invention, the connection wiring film 310 may be disposed on at least one side surface and a back surface of the display panel 100 or the first substrate 110. However, the connection wiring film 310 may not be attached to an upper surface of the display panel 100 or the first substrate 110.

In addition, according to an exemplary embodiment of the present invention, the connection wiring film 310 includes a connection wiring 313, and may not include an element such as a thin film transistor.

The structure through which the connection wiring film 310 is disposed on at least one side surface of the display panel 100 will be described below in detail with reference to FIGS. 3 to 6.

The plurality of data drivers 250 generates gray scale voltages according to an image data applied from the signal controller 270 based on a data control signal received from the signal controller 270. The data driver 250 outputs the gray scale voltages to the plurality of data lines DL1 to DLm as data signals. However, the present invention is not limited thereto, and one data driver 250 may generate all of the gray scale voltages.

The data driver 250 may include a data driving chip 251 and a data circuit board 253 on which the data driving chip 251 is mounted. According to an exemplary embodiment of the present invention, the data circuit board 253 may be a flexible printed circuit board. The data circuit board 253 electrically connects the main circuit board 210 and the first substrate 110. The plurality of data driving chips 251 apply the data signals to corresponding ones of the plurality of data lines DL1 to DLm. For example, a first data driving chip 251 may apply data signals to a first group of the data lines DL1 to DLm, and a second data driving chip 251 may apply data signals to a second group of the data lines DL1 to DLm.

According to an exemplary embodiment of the present invention, the data circuit board 253 may be disposed on another side surface of the side surfaces of the display panel 100. For example, the data circuit board 253 may be disposed on another side surface of the side surfaces of the first substrate 110. In other words, since one end of the data circuit board 253 is not disposed in the non-display area NDA of the display panel 100, the non-display area NDA may have a smaller area than a display panel that includes a conventional data circuit board in its non-display area. Accordingly, the display area DA of the display panel 100 according an exemplary embodiment of the present invention may be enlarged.

The side surface of the display panel 100 on which the data circuit board 253 is disposed may be different from the side surface of the display panel 100 on which the gate circuit board 233 is disposed.

The gate control signal output from the signal controller 270 may be applied to the gate circuit board 233 via the data circuit board 253. To accomplish this, a dummy line 255 for transmitting the gate signal output from the signal controller 270 to the gate circuit board 233 may be disposed on the data circuit board 253. In such an embodiment, the data circuit board 253 on which the dummy line 255 is disposed may be the closest of the data circuit boards 253 to the gate circuit board 233 to which the dummy line 255 is connected.

The connection wiring film 310 may be disposed between the data drivers 250.

The signal controller 270 may be mounted on the main circuit board 210. The signal controller 270 receives an image data and a control signal from an external graphic controller. The control signal may include a vertical synchronization signal for discriminating frame periods, a horizontal synchronization signal for discriminating horizontal periods, e.g., a row discriminating signal, and a data enable signal which has a high level for a data output period to represent a data input section, a clock signal, and the like. However, the present invention is not limited thereto, and the control signal may include a plurality of signals for driving the gate driver 230 and the data driver 250.

The signal controller 270 generates a gate control signal for controlling the gate driver 230, and transmits the gate control signal to the gate driver 230. The signal controller 270 generates a data control signal for controlling the data driver 250, and transmits the data control signal to the data driver 250.

Figure 3:
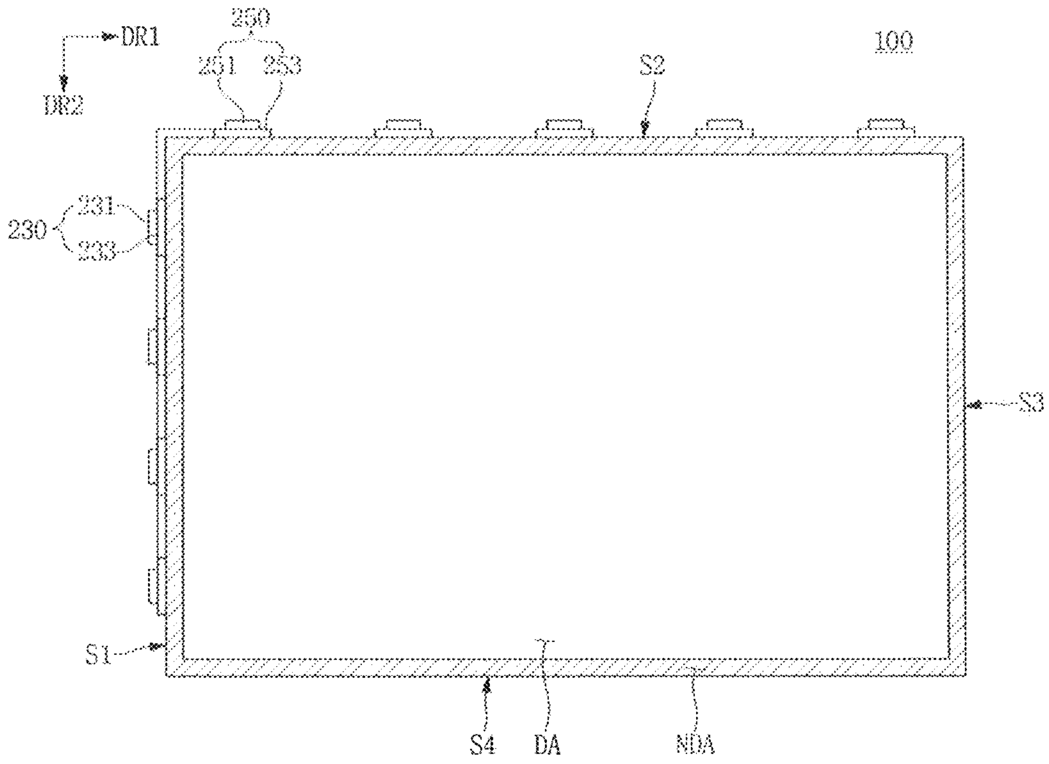
FIG. 3 is a plan view illustrating a display device according to an exemplary embodiment of the present invention.

FIG. 3 is a plan view illustrating a display device according to an exemplary embodiment of the present invention.

Referring to FIG. 3, the display panel 100 may include a first side surface S1, a second side surface S2, a third side surface S3, and a fourth side surface S4. For example, the first substrate 110 may include the first side surface S1, the second side surface S2, the third side surface S3, and the fourth side surface S4. The second side surface S2 and the fourth side surface S4 may oppose each other in the second direction DR2. Each of the first side surface S1 and the third side surface S3 is connected to each of the second side surface S2 and the fourth side surface S4, and may oppose each other in the first direction DR1.

According to an exemplary embodiment of the present invention, the plurality of gate drivers 230 may be disposed on the first side surface S1 of the display panel 100, and the plurality of data drivers 250 may be disposed on the second side surface S2 of the display panel 100. For example, the plurality of gate drivers 230 may be disposed on the first side surface S1 of the first substrate 110, and the plurality of data drivers 250 may be disposed on the second side surface S2 of the first substrate 110. The plurality of gate drivers 230 may be disposed on the first side surface S1 along the second direction DR2, and the plurality of data drivers 250 may be disposed on the second side surface S2 along the first direction DR1. However, the present invention is not limited thereto.

According to an exemplary embodiment of the present invention, the connection wiring film 310 may be disposed on at least one side surface of the display panel 100 or the first substrate 110.

Hereinafter, the structure in which the gate driver 230 and the connection wiring film 310 are disposed on one side surface of the display panel 100 will be described in detail referring to FIGS. 4A to 6.

Figure 4A:
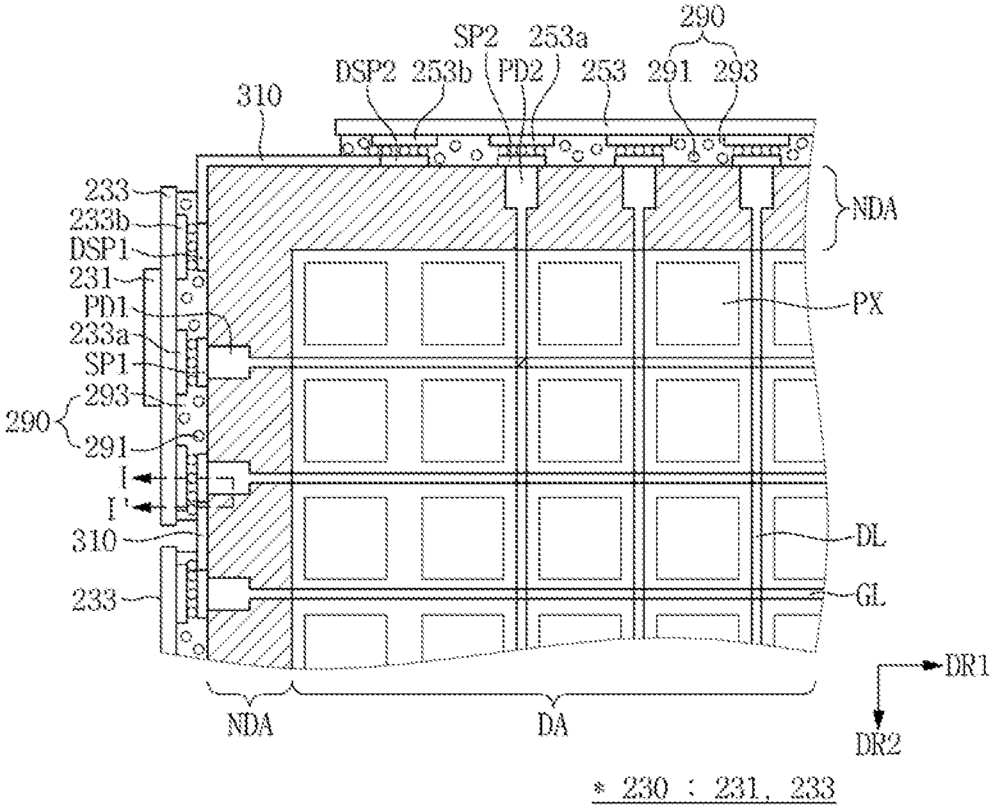
FIG. 4A is an enlarged view illustrating a part of a display device according to an exemplary embodiment of the present invention.
Figure 4A:
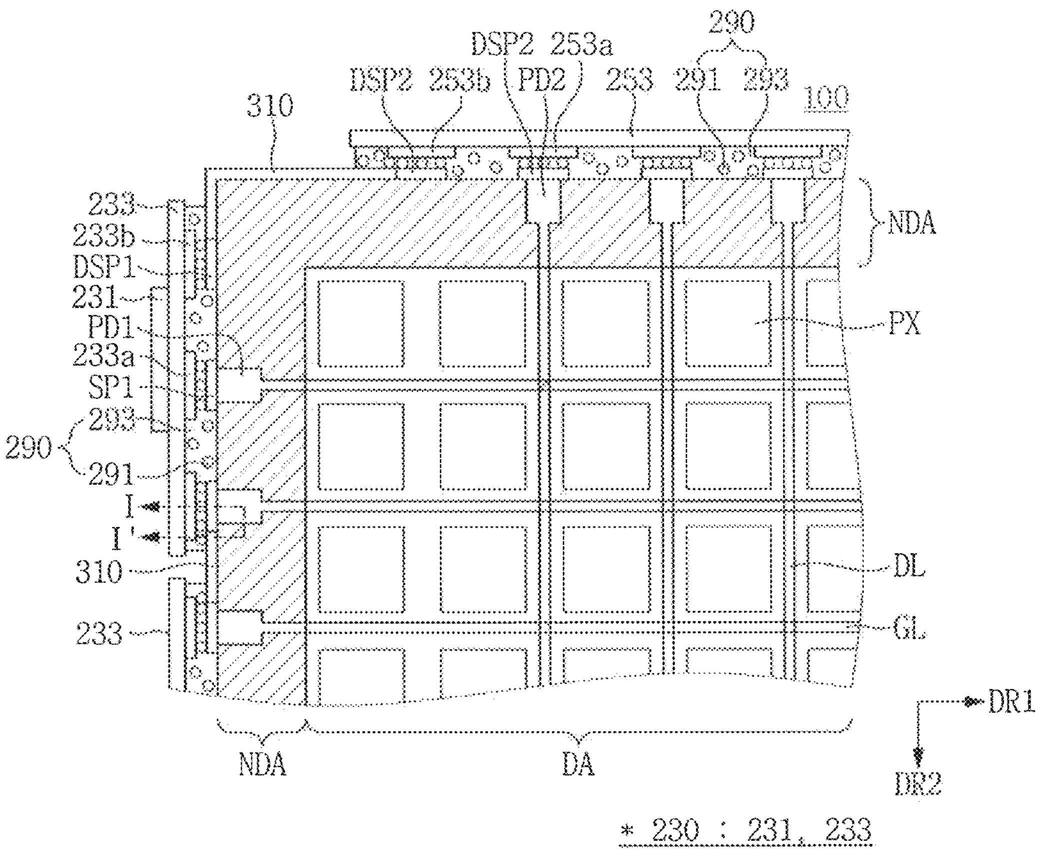
Figure 4B:
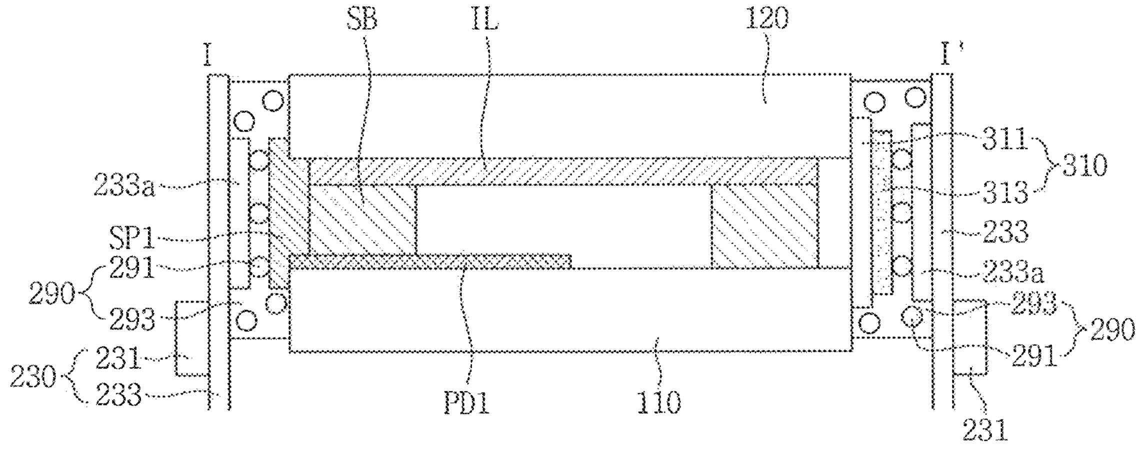
FIG. 4B is a cross-sectional view taken along line I-I' of FIG. 4A, according to an exemplary embodiment of the present invention.
Figure 5A:
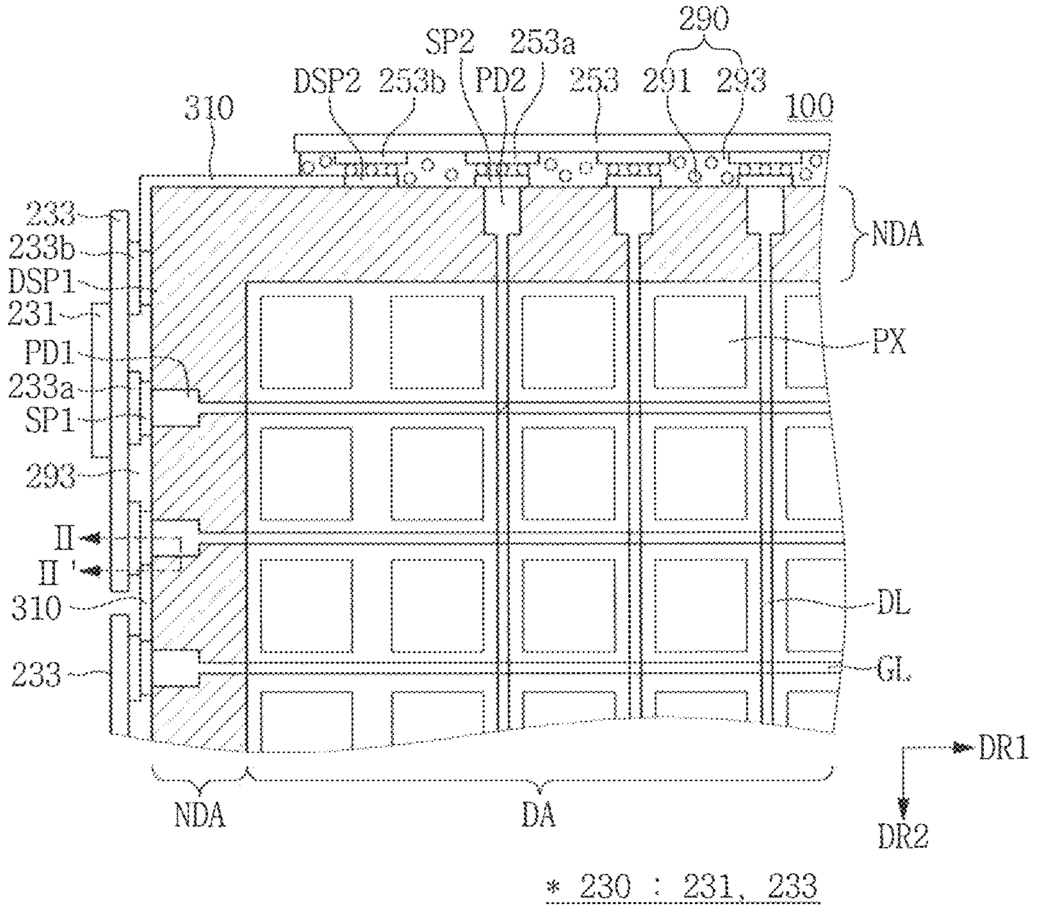
FIG. 5A is an enlarged view of a part of a display device according to an exemplary embodiment of the present invention.
Figure 5B:
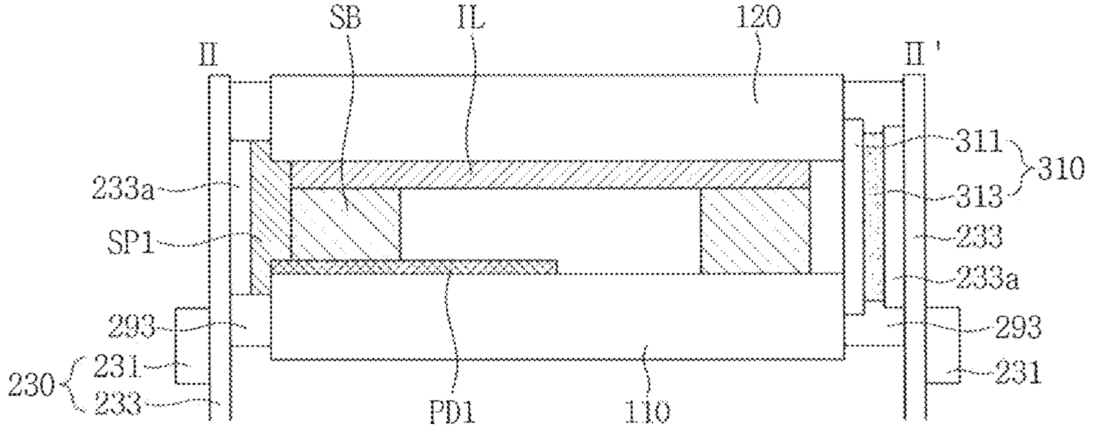
FIG. 5B is a cross-sectional view taken along line II-II' of FIG. 5A, according to an exemplary embodiment of the present invention.
Figure 6:
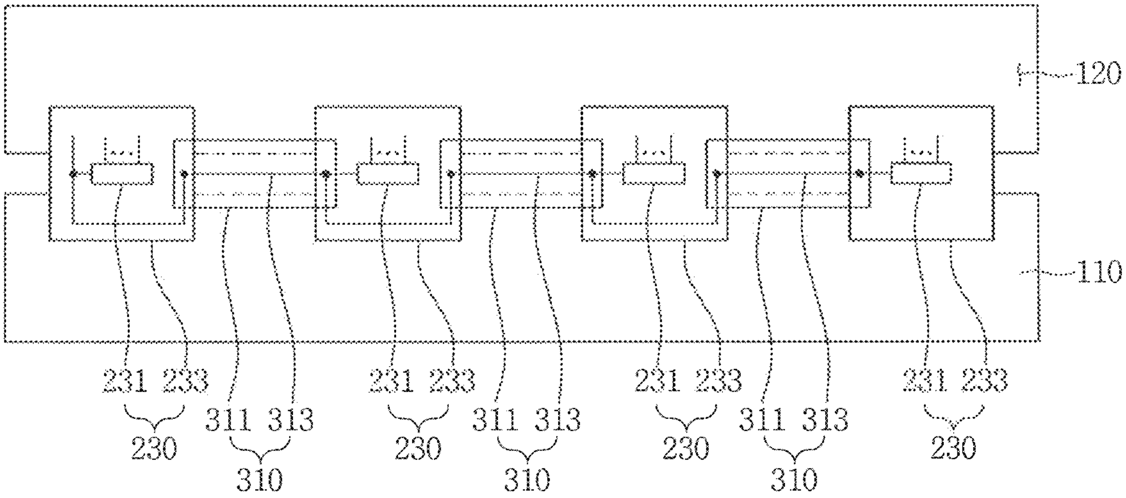
FIG. 6 is a side view illustrating a display device according to an exemplary embodiment of the present invention.

FIG. 4A is an enlarged view illustrating a part of a display device according to an exemplary embodiment of the present invention, FIG. 4B is a cross-sectional view taken along line I-I' of FIG. 4A, according to an exemplary embodiment of the present invention, FIG. 5A is an enlarged view of a part of a display device according to an exemplary embodiment of the present invention, FIG. 5B is a cross-sectional view taken along line II-II' of FIG. 5A, according to an exemplary embodiment of the present invention, and FIG. 6 is a side view illustrating a display device according to an exemplary embodiment of the present invention.

Referring to FIG. 4A, the display panel 100 includes a plurality of pads disposed at an edge of the display panel 100. In such an embodiment, the plurality of pads include a gate pad PD1 extending from the gate line GL and a data pad PD2 extending from the data line DL. In other words, the first substrate 110 includes the gate pad PD1 and the data pad PD2.

The gate pad PD1 includes a plurality of gate pads PD1 corresponding to the number of gate lines GL, and the data pad PD2 includes a plurality of data pads PD2 corresponding to the number of data lines DL. The gate pad PD1 and the data pad PD2 are disposed in the non-display area NDA.

The display panel 100 includes a plurality of first side electrodes SP1 and a first dummy side electrode DSP1. The plurality of first side electrodes SP1 and the first dummy side electrode DSP1 are disposed on the first side surface S1 of the display panel 100. Each of the first side electrodes SP1 is directly connected to a corresponding one of the gate pads PD1. For example, the plurality of first side electrodes SP1 and the first dummy side electrode DSP1 are disposed on the first side surface S1 of the first substrate 110. Each of the first side electrodes SP1 is directly connected to a corresponding one of the gate pads PD1 disposed at the first substrate 110. The first dummy side electrode DSP1 may be disposed on the first side surface S1 in an area where it can be the closest electrode to the second side surface S2. The display panel 100 may further include another dummy side electrode disposed on the first side surface S1; however, this dummy side electrode may be disposed in an area where it can be the closest electrode to the fourth side surface S4.

The display panel 100 includes a second side electrode SP2 and a second dummy side electrode DSP2. The plurality of second side electrodes SP2 and the second dummy side electrode DSP2 are disposed on the second side surface S2. Each of the second side electrodes SP2 may be directly connected to a corresponding one of the data pads PD2. For example, the plurality of second side electrodes SP2 and the second dummy side electrode DSP2 are disposed on the second side surface S2 of the first substrate 110. Each of the second side electrodes SP2 is directly connected to a corresponding one of the data pads PD2 disposed at the first substrate 110. The second dummy side electrode DSP2 may be disposed on the second side surface S2 to be the closest electrode to the first side surface S1. For example, the second dummy side electrode DSP2 may be situated close to the first dummy side electrode DSP1.

It is to be understood that the number of the first dummy side electrode DSP1 and the second dummy side electrode DSP2 are not limited to those illustrated in FIG. 4A. For example, the first dummy side electrode DSP1 and the second dummy side electrode DSP2 may be provided in plural. The number of the first dummy side electrode DSP1 and the second dummy side electrode DSP2 may correspond to the number of signals output from the signal controller 270. For example, when five control signals are output from the signal controller 270, five first dummy side electrodes DSP1 and five second dummy side electrodes DSP2 may be provided.

The first and second side electrodes SP1 and SP2 and the first and second dummy side electrodes DSP1 and DSP2 may include a metal material including silver (Ag) or carbon (C).

The first and second side electrodes SP1 and SP2 and the first and second dummy side electrodes DSP1 and DSP2 may be formed on the first side surface S1 and the second side surface S2, respectively, by depositing a metal material, and then, forming an electrode through a laser or by a silk screen method. However, the present invention is not limited thereto, and the first and second side electrodes SP1 and SP2 may be formed on the first and second side surfaces S1 and S2 of the display panel 100 in various ways.

Referring to FIGS. 4A and 4B, the gate circuit board 233 included in each of the gate drivers 230 includes a first base film and a first line electrode 233*a*. In addition, at least one of the gate drivers 230 further includes a first dummy line electrode 233*b*.

The first base film may include or be formed of a flexible material, for example, polyimide. The first line electrode 233*a* may include a plurality of first line electrodes 233*a* disposed on the first base film. The first line electrode 233*a* is connected to the gate driving chip 231 and may receive the gate signal output from the gate driving chip 231. The first line electrode 233*a* may transmit the received gate signal to the first side electrode SP1 through an anisotropic conductive film 290.

As illustrated in FIGS. 4A and 4B, the first dummy line electrode 233*b* may be electrically connected to the first dummy side electrode DSP1 through the anisotropic conductive film 290. In other words, the gate control signal provided to the first dummy side electrode DSP1 may be transmitted to the first dummy line electrode 233*b* through the anisotropic conductive film 290.

The anisotropic conductive film 290 includes conductive particles 291 formed in an adhesive film 293 having an adhesiveness. The conductive particles 291 electrically connect, e.g., the first dummy line electrode 233*b* and the first dummy side electrode DSP1. However, the present invention is not limited thereto, and as illustrated in FIGS. 5A and 5B, the first dummy line electrode 233*b* may directly contact the first dummy side electrode DSP1. In other words, the first dummy line electrode 233*b* may be electrically connected to the first dummy side electrode DSP1. In other words, the gate control signal provided to the first dummy line electrode 233*b* may be directly transmitted to the first dummy side electrode DSP1.

Referring to FIG. 4A, the connection wiring film 310 according to an exemplary embodiment of the present invention may be attached to a side surface to which the gate driver 230 is attached. The connection wiring film 310 may be attached to the side surface of the display panel 100 with an adhesive member therebetween. The connection wiring film 310 may also be attached to a side surface to which the data driver 250 is attached.

According to an exemplary embodiment of the present invention, the connection wiring film 310 is attached to a side surface and a back surface of the display panel 100 or the first substrate 110. However, the connection wiring film 310 may not be attached to an upper surface of the display panel 100 or the first substrate 110.

In addition, according to an exemplary embodiment of the present invention, the connection wiring film 310 includes the connection wiring 313, and may not include an element such as a thin film transistor. For example, the connection wiring film 310 may include only the connection wiring 313.

The connection wiring film 310 electrically connects the gate drivers 230. In other words, a plurality of the connection wiring films 310 are provided so that each individual connection wiring film 310 connects two adjacent gate drivers 230 to each other. However, the present invention is not limited thereto, and the connection wiring film 310 may electrically connect the data drivers 250 to each other. The connection wiring film 310 will be described in detail with reference to FIG. 6.

Referring to FIGS. 4A and 4B, the data circuit board 253 included in each of the data drivers 250 includes a second base film and a second line electrode 253*a*. In addition, at least one of the data drivers 250 further includes a second dummy line electrode 253*b*. Such a data driver may be connected to the connection wiring film 310.

The second base film may include or be formed of a flexible material, for example, polyimide. The second line electrode 253*a* may include a plurality of second line electrodes 253*a* disposed on the second base film. The second line electrode 253*a* may be connected to the data driving chip 251 and may receive the data signal output from the data driving chip 251. The second line electrode 253*a* may transmit the received data signal to the second side electrode SP2 through the anisotropic conductive film 290.

The second dummy line electrode 253*b* may be electrically connected to the second dummy side electrode DSP2 through the anisotropic conductive film 290. The second dummy line electrode 253*b* may be connected to the dummy line 255. In other words, the gate control signal output from the signal controller 270 may be transmitted to the second dummy line electrode 253*b* through the dummy line 255. The gate control signal transmitted to the second dummy line electrode 253*b* may be provided to the second dummy side electrode DSP2 through a bridge line BL.

The first and second line electrodes 233*a* and 253*b* and the first and second dummy line electrodes 233*b* and 253*b* may include or be formed of copper (Cu), silver (Ag), gold (Au), aluminum (Al), or the like.

Referring to FIG. 4B, the gate pad PD1 may be directly connected to the gate line GL and the first side electrode SP1. The data pad PD2 may also be disposed on the first substrate 110. In such an embodiment, the gate pad PD1 and the data pad PD2 may be disposed on substantially the same layer together with the gate lines GL1 to GLn and the data lines DL1 to DLm.

A black matrix may be disposed at the non-display area NDA of the second substrate 120 to substantially prevent light from being emitted to the outside.

In an exemplary embodiment of the inventive concept, a liquid crystal layer and an adhesive member SB for substantially preventing the liquid crystal layer from being leaked to the outside may be disposed between the first substrate 110 and the second substrate 120. Such an adhesive member SB may be disposed between the first substrate 110 and the second substrate 120, along an edge of the display panel 100. In particular, the adhesive member SB may be disposed on the gate pad PD1 and an insulating layer IL, and may support the first side electrode SP1.

In addition, a dam may be disposed between two adjacent first side electrodes SP1. The dam may also be disposed between the first substrate 110 and the second substrate 120. The structure of the dam may be variously changed depending on the formation of a particular side electrode, and the side electrodes, e.g., the first side electrode SP1, may be supported by the dam.

Referring to FIGS. 4A to 6, the connection wiring film 310 according to an exemplary embodiment of the present invention may be disposed on at least one side surface of the display panel 100 on which the gate driver 230 is disposed. For example, as illustrated in FIG. 6, the connection wiring film 310 may be disposed between the gate drivers 230 on the first side surface S1 of the display panel 100 on which the gate drivers 230 are disposed. The connection wiring film 310 according to an exemplary embodiment of the present invention may also be disposed on at least one side surface of the display panel 100 on which the data drivers 250 are disposed.

The connection wiring film 310 electrically connects the gate drivers 230 that are adjacent to the connection wiring film 310. For example, two gate drivers 230 may be connected to each other by the connection wiring film 310 disposed therebetween. The connection wiring film 310 may be a flexible printed circuit board (PCB). The connection wiring film 310 may include a base portion 311 and the connection wiring 313.

The base portion 311 may include or be formed of a flexible material, for example, polyimide.

The connection wiring 313 may be disposed on the base portion 311. According to an exemplary embodiment of the present invention, the connection wiring 313 may not be connected to an element such as a thin film transistor on the base portion 311, since no separate element is located on the base portion 311.

Referring to FIGS. 4A and 4B, the connection wiring 313 is connected to the gate driving chips 231 that are adjacent to the connection wiring film 310, and may transmit the gate signal output from one of the gate driving chips 231 to another of the gate driving chips 231. The connection wiring 313 may be connected to the first line electrodes 233*a* of the adjacent gate circuit boards 233 through the anisotropic conductive film 290. For example, the first line electrode 233*a* may transmit the received gate signal to the first side electrode SP1 and the connection wiring 313 through the anisotropic conductive film 290. The gate signal output from the first line electrode 233*a* of one gate driver 230 is transmitted to the connection wiring 313 through the anisotropic conductive film 290, and the gate signal transmitted to the connection wiring 313 may be transmitted to the first line electrode 233*a* of another gate driver 230 through the anisotropic conductive film 290. However, the present invention is not limited thereto, and as illustrated in FIGS. 5A and 5B, the connection wiring 313 may directly contact the first line electrode 233*a* of the gate circuit board 233 that is adjacent to the connection wiring film 310. In other words, the connection wiring 313 may be electrically connected to the first line electrode 233*a*. However, the present invention is not limited thereto. For example, the connection wiring 313 may be connected to two of the data driving chips 251 that are adjacent to the connection wiring film 310. In this case, the connection wiring 313 may transmit the data signal output from one of the data driving chips 251 to the other data driving chip 251.

According to an exemplary embodiment of the present invention, the connection wiring film 310 may transmit the gate control signal output from the signal controller 270 to the gate driver 230. For example, the connection wiring 313 of the connection wiring film 310 electrically connects the first dummy side electrode DSP1 and the second dummy side electrode DSP2 to transmit the gate control signal output from the second dummy side electrode DSP2 to the first dummy side electrode DSP1 through the anisotropic conductive film 290.

According to an exemplary embodiment of the present invention, the connection wiring film 310 including the connection wiring 313 is disposed on the side surface of the display panel 100, and thus, the non-display area NDA may be reduced. Accordingly, the display area DA of the display panel 100 according to an exemplary embodiment of the present invention may be enlarged.

In addition, according to an exemplary embodiment of the present invention, the connection wiring 313 disposed at the base portion 311 on the side surface of the display panel 100 is not affected by peripheral wirings, and thus, the thickness of the connection wiring 313 may be increased and the resistance may be reduced. Accordingly, the display panel 100 according to an exemplary embodiment of the present invention may reduce display defects due to the resistance of the connection wirings 313 disposed between the gate drivers 230.

Figure 7A:
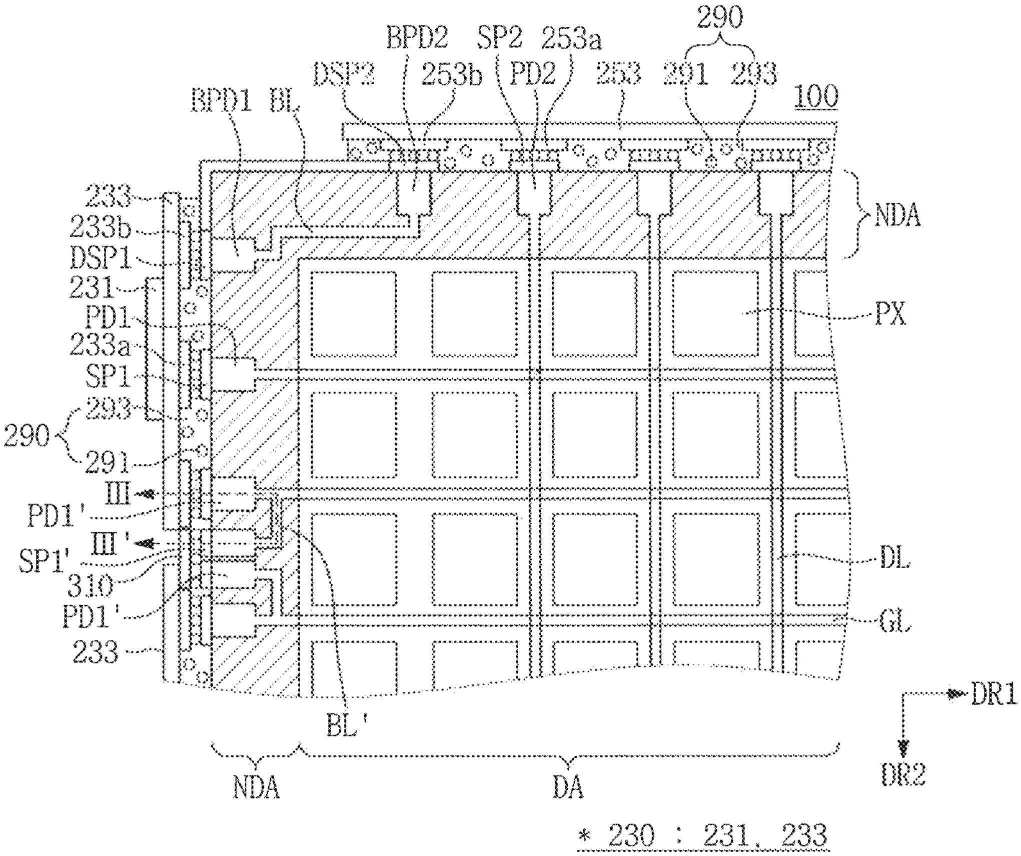
FIG. 7A is an enlarged view of a part of a display device according to an exemplary embodiment of the present invention.
Figure 7A:
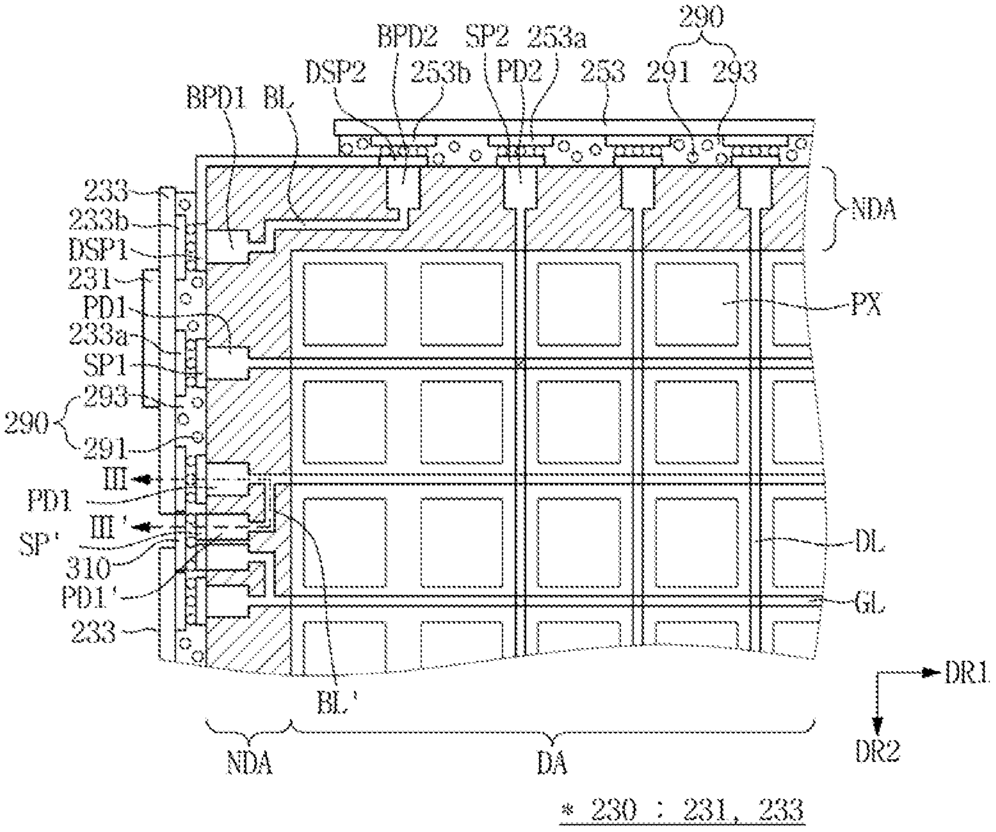
Figure 7B:
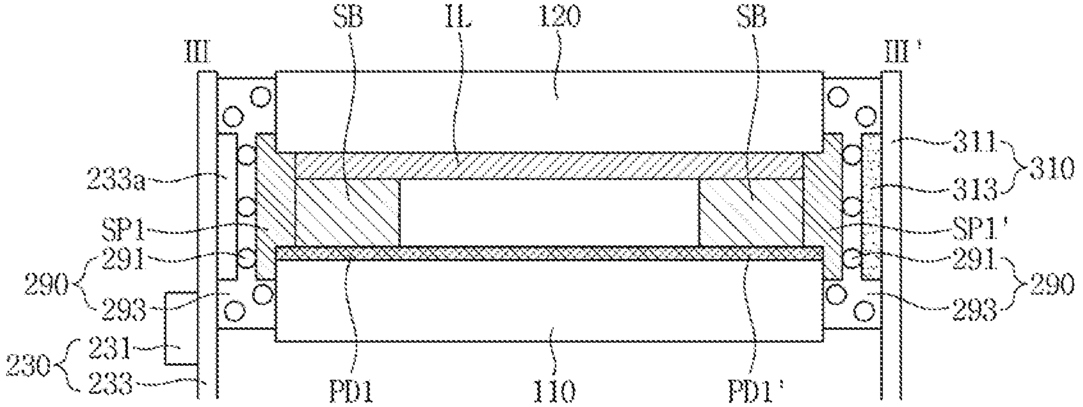
FIG. 7B is a cross-sectional view taken along line III-III' of FIG. 7A, according to an exemplary embodiment of the present invention.
Figure 8A:
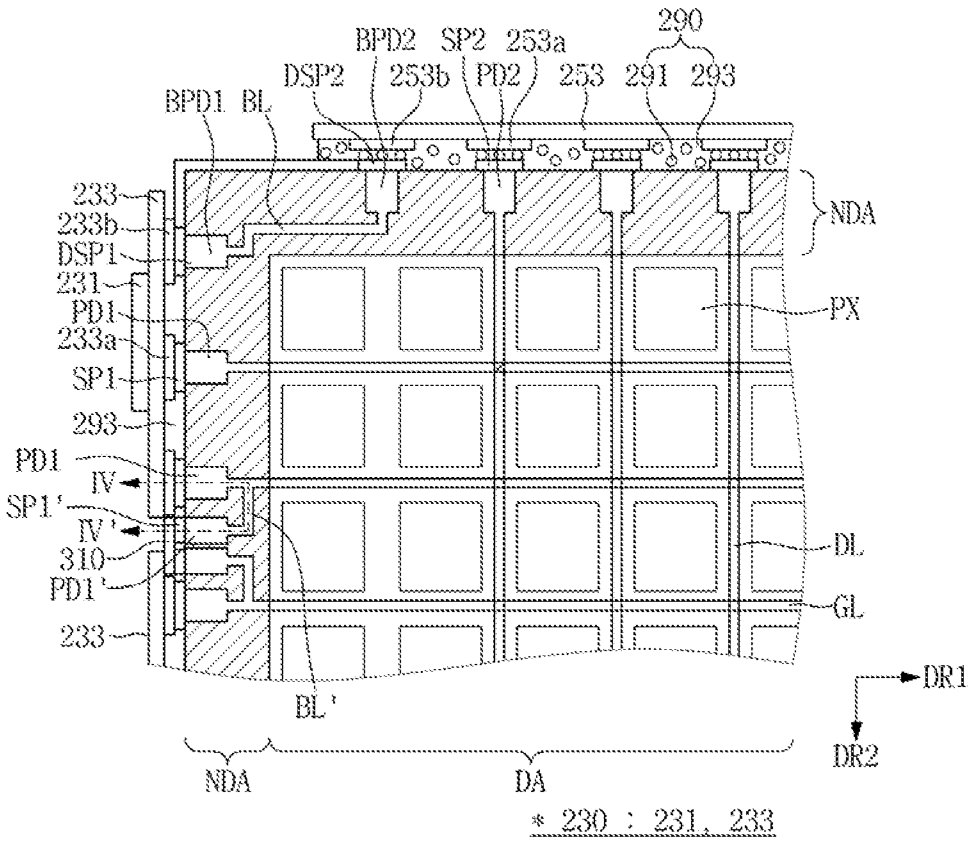
FIG. 8A is an enlarged view of a part of a display device according to an exemplary embodiment of the present invention.
Figure 8B:
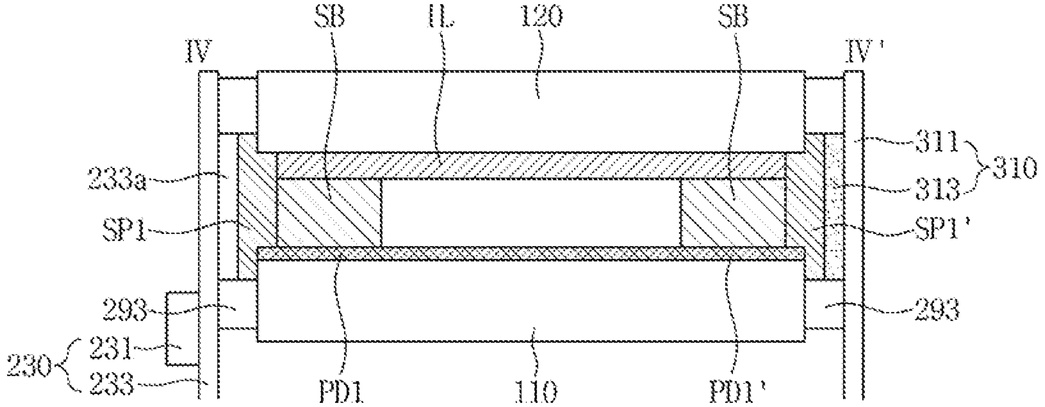
FIG. 8B is a cross-sectional view taken along line IV-IV' of FIG. 8A, according to an exemplary embodiment of the present invention.

FIG. 7A is a view of an enlarged part of a display device according to an exemplary embodiment of the present invention, FIG. 7B is a cross-sectional view taken along line III-III' of FIG. 7A, according to an exemplary embodiment of the present invention, FIG. 8A is a view of an enlarged part of a display device according to an exemplary embodiment of the present invention, and FIG. 8B is a cross-sectional view taken along line IV-IV' of FIG. 8A, according to an exemplary embodiment of the present invention.

Redundant descriptions of the display device of FIGS. 1 to 6 maybe omitted from the descriptions of the display device of FIGS. 7A to 8B.

Referring to FIGS. 7A and 7B, according to an exemplary embodiment of the present invention, the display panel 100 further includes a first bridge pad BPD1, a second bridge pad BPD2, and a bridge line BL.

As illustrated in FIG. 7A, the first bridge pad BPD1, the second bridge pad BPD2, and the bridge line BL may transmit the gate control signal output from the signal controller 270 to the gate driver 230. For example, the first bridge pad BPD1 and the second bridge pad BPD2 directly contact the first dummy side electrode DSP1 and the second dummy side electrode DSP2, respectively, to be connected thereto. The first bridge pad BPD1 and the second bridge pad BPD2 are connected to each other through the bridge line BL disposed on the display panel 100.

According to an exemplary embodiment of the present invention, the display panel 100 may further include an auxiliary pad PD1', an auxiliary bridge line BL' and an auxiliary side electrode SP1'. For example, the first substrate 110 may further include the auxiliary pad PD1' and the auxiliary bridge line BU, and the auxiliary side electrode SP1' may be disposed on a side surface of the first substrate 110.

The auxiliary pad PD1' may be disposed on the first substrate 110. The auxiliary pad PD1' may be directly connected to the auxiliary bridge line BL' and the auxiliary side electrode SP'.

The auxiliary bridge line BU electrically connects the gate pad PD1 or the data pad PD2 to the auxiliary pad PD1'. For example, the auxiliary bridge line BL' may extend from the gate pad PD1 to be connected to the auxiliary pad PDF', and may electrically connect the gate pad PD1 and the auxiliary pad PD1'.

The auxiliary side electrode SP1' may be disposed on the first side surface S1, similar to the first side electrode SP1, and may be directly connected to the auxiliary pad PD1'.

The auxiliary side electrode SP1' may be electrically connected to the connection wiring film 310 through the anisotropic conductive film 290 (see FIG. 7A) or through a direct contact (see FIG. 8A).

Accordingly, the gate signal output from one gate driver 230 may be transmitted to another gate driver 230 through the auxiliary pad PD1', the auxiliary bridge line BL', and the auxiliary side electrode SP1' disposed in the display panel 100. For example, the auxiliary pad PD1', the auxiliary bridge line BL', and the auxiliary side electrode SP1' may transmit the gate signal output from one of the gate driving chips 231 to the connection wiring film 310. The connection wiring film 310 may transmit the gate signal to another auxiliary pad PD1', another auxiliary bridge line BL', and another auxiliary side electrode SP1' adjacent thereto. The another auxiliary pad PD1', the another auxiliary bridge line BL', and the another auxiliary side electrode SP1' may transmit the gate signal to another of the gate driving chips 231.

Referring to FIGS. 7A and 7B, the connection wiring 313 may be disposed on the base portion 311. The connection wiring 313 may be connected to the gate circuit board 233 through the anisotropic conductive film 290. For example, the connection wiring 313 may be electrically connected to the first line electrode 233*a* of the gate circuit board 233 that is adjacent to the connection wiring film 310 through the anisotropic conductive film 290. Accordingly, the gate signal transmitted to one of the first line electrodes 233_a_ may be transmitted to the connection wiring 313 through the anisotropic conductive film 290, and the gate signal transmitted to the connection wiring 313 may be transmitted to another of the first line electrodes 233_a_ through the anisotropic conductive film 290. However, the present invention is not limited thereto. For example, as illustrated in FIGS. 8A and 8B, the connection wiring 313 may directly contact the first line electrode 233_a_ of the gate circuit board 233 that is adjacent to the connection wiring film 310. In other words, the connection wiring 313 may be electrically connected to the first line electrode 233_a_ of the gate circuit board 233 that is adjacent to the connection wiring film 310. Therefore, signals may be directly transferred between the directly connected connection wiring 313 and first line electrode 233_a_.

As set forth hereinabove, according to exemplary embodiments of the present invention, the display device includes a flexible printed circuit board which includes a control signal line for connecting a plurality of drivers at a side surface of a display panel, thereby reducing the bezel area of the display device and improving the signal delay.

While the present invention has been illustrated and described with reference to exemplary embodiments thereof, it will be apparent to those of ordinary skill in the art that various changes in form and detail may be made thereto without departing from the spirit and scope of the present invention as defined by the following claims.

What is claimed is:

1. A display device, comprising:

a display substrate comprising an upper surface, a lower surface facing the upper surface, a first side surface connected to the upper surface and the lower surface and a second side surface connected to the first side surface, the upper surface including a display area;

a plurality of drivers disposed on the first and second side surfaces of the display substrate; and a connection wiring film attached to the first and second side surfaces of the display substrate, wherein a portion of the connection wiring film extends from the first side surface to the second side surface to electrically connect the drivers at the first and second side surfaces to each other, wherein the connection wiring film is not disposed on the upper surface of the display substrate, wherein the connection wiring film comprises:

a base portion disposed between two adjacent drivers; and a connection wiring disposed on the base portion and electrically connecting the two adjacent drivers.

2. The display device of claim 1, wherein the drivers comprise a gate driver and a data driver, and wherein, the connection wiring film, electrically connects the gate driver and the data driver to each other.

3. The display device of claim 1, wherein the drivers comprise:

a gate driver and a data driver; and a bridge wiring disposed on the upper surface of the display substrate, wherein the bridge wiring electrically connects the gate driver and the data driver to each other.

4. The display device of claim 1, wherein the plurality of drivers lace the first and second side surfaces of the display substrate.

5. The display device of claim 4, wherein the plurality of drivers contact the first and second side surfaces of the display substrate.

6. A display device, comprising:

a display substrate comprising an upper surface, a lower surface facing the upper surface, and a side surface connected to the upper surface and the lower surface, the upper surface including a display area;

a plurality of drivers disposed on the side surface of the display substrate: and a connection wiring film attached to the side surface of the display substrate and electrically connecting the drivers, wherein the connection wiring film is not disposed on the upper surface of the display substrate, wherein the display substrate comprises:

a plurality of pixels;

a gate line and a data line for driving the plurality of pixels;

a gate pad disposed on the upper surface of the display substrate;

a data pad disposed on the upper surface of the display substrate;

a first side electrode electrically connected to the gate pad and disposed on the side surface of the display substrate; and a second side electrode electrically connected to the data pad and disposed on the side surface of the display substrate.

7. The display device of claim 6, wherein at least one of the drivers comprises:

a circuit board comprising a first line electrode; and a driving chip.

8. The display device of claim 7, further comprising an anisotropic conductive film disposed between the first line electrode and the first side electrode.

9. The display device of claim 7, further comprising an anisotropic conductive film disposed between the connection wiring film and the first side electrode.

10. The display device of claim 7, wherein the display substrate further comprises:

an auxiliary pad disposed on the upper surface of the display substrate and connected to the gate pad;

an auxiliary side electrode electrically connected to the auxiliary pad and disposed on the side surface of the display substrate; and anisotropic conductive film disposed between the connection wiring film and the auxiliary side electrode.

11. The display device of claim 7, wherein the first line electrode directly contacts the first side electrode.

12. The display device of claim 7, wherein the connection wiring film directly contacts the first side electrode.

13. The display device of claim 7, wherein the display substrate further comprises:

an auxiliary pad connected to the gate pad; and an auxiliary side electrode electrically connected to the auxiliary pad and disposed on the side surface of the display substrate, and wherein the connection wiring film directly contacts the auxiliary side electrode.

14. A display device, comprising:

a display substrate comprising an upper surface, a lower surface facing the upper surface, and a side surface connected to the upper surface and the lower surface, the upper surface including a display area;

a plurality of drivers disposed on the side surface of the display substrate; and a connection wiring film disposed between the plurality of drivers and electrically connecting the drivers, wherein the connection wiring film comprises a base portion, wherein the connection wiring film is attached to the side surface of the display substrate, wherein the display substrate comprises:

a pad electrically connected to at least one of the plurality of drivers;

an auxiliary pad connected to the pad through an auxiliary bridge line;

an auxiliary side electrode electrically connected to the auxiliary pad and disposed on the side surface of the display substrate; and an anisotropic conductive film disposed between the connection wiring film and the auxiliary side electrode.

15. The display device of claim 14, wherein the anisotropic conductive film is disposed between the side surface of the display substrate and the plurality of drivers to electrically connect the display substrate with the plurality of drivers.

16. The display device of claim 14, wherein the anisotropic conductive film electrically connects the plurality of drivers with the connection wiring film.

17. The display device of claim 14, further comprising a first side electrode disposed on the side surface of the display substrate, wherein the first side electrode is directly, connected to at least one of the plurality of drivers.

18. The display device of claim 14, wherein the connection wiring film is directly connected to at least one of the plurality of drivers.

19. A display device, comprising:

a display substrate comprising, an upper surface, a lower surface facing, the upper surface, and a side surface connected to the upper surface and the lower surface, the upper surface including a display area;

a plurality of drivers disposed on the side surface of the display substrate; and a connection wiring film disposed between the plurality of drivers and electrically connecting the drivers, wherein the connection wiring film comprises a base portion, wherein the connection wiring film is attached to the side surface of the display substrate, wherein the display substrate comprises:

a pad electrically connected to at least one of the plurality of drivers;

an auxiliary pad connected to the pad through an auxiliary bridge line; and an auxiliary side electrode electrically connected to the auxiliary pad and disposed on the side surface of the display substrate, wherein the connection wiring film is directly connected to the auxiliary side electrode.

* * * * *